(12) United States Patent
Delbecq et al.

(10) Patent No.: US 11,652,470 B2
(45) Date of Patent: May 16, 2023

(54) PHASE ROTATOR CONTROL APPARATUS AND METHOD THEREFOR

(71) Applicant: NXP USA, INC., Austin, TX (US)

(72) Inventors: Dominique Delbecq, Fonsorbes (FR); Julien Orlando, Toulouse (FR)

(73) Assignee: NXP USA, INC., Austin, TX (US)

( * ) Notice: Subject to any disclaimer, the term of this patent is extended or adjusted under 35 U.S.C. 154(b) by 246 days.

(21) Appl. No.: 17/204,290

(22) Filed: Mar. 17, 2021

(65) Prior Publication Data

US 2021/0305969 A1  Sep. 30, 2021

(30) Foreign Application Priority Data

Mar. 25, 2020 (EP) .................................... 20305322

(51) Int. Cl.
  *H03K 5/01* (2006.01)
  *H03H 11/16* (2006.01)
  *H03H 11/04* (2006.01)
  *H03K 5/00* (2006.01)

(52) U.S. Cl.
  CPC ............. *H03H 11/16* (2013.01); *H03H 11/04* (2013.01); *H03K 5/01* (2013.01); *H03K 2005/00286* (2013.01)

(58) Field of Classification Search
  CPC ........... H03K 5/01; H03K 5/13; H03K 5/131; H03K 5/134; H03K 2005/00286
  USPC .................................... 327/231–237; 375/371
  See application file for complete search history.

(56) References Cited

U.S. PATENT DOCUMENTS

| | | | |
|---|---|---|---|
| 9,835,715 B2 | 12/2017 | Delbecq et al. | |
| 9,973,360 B2 | 8/2018 | Doare et al. | |
| 11,460,542 B2* | 10/2022 | Doare | G01S 7/40 |
| 11,496,122 B2* | 11/2022 | Delbecq | H03K 5/01 |
| 2004/0056698 A1 | 3/2004 | Elliott et al. | |
| 2015/0222286 A1 | 8/2015 | Zhang et al. | |

OTHER PUBLICATIONS

Li, Z., "TD-SCDMA/HSDPA Transceiver and Analog Baseband Chipset in 0.18-μm CMOS Process", IEEE Transactions on Circuits and Systems II: Express Briefs, vol. 57, No. 2, pp. 90-94, Feb. 1, 2010.

* cited by examiner

*Primary Examiner* — Hai L Nguyen

(57) ABSTRACT

A phase rotator control circuit is provided. The phase rotator control circuit is coupled to a phase rotator core and includes a first set of transistors coupled to receive digital control signals. The first set of transistors is coupled to a second set of transistors configured and arranged to form a filtered current mirror. An output of the filtered current mirror is coupled to provide an analog phase control signal to the phase rotator core.

20 Claims, 5 Drawing Sheets

PHASE ROTATOR CONTROL APPARATUS AND METHOD THEREFOR

CROSS-REFERENCE TO RELATED APPLICATIONS

This application claims the priority under 35 U.S.C. § 119 of European Patent application no. 20305322.8, filed on 25 Mar. 2020, the contents of which are incorporated by reference herein.

BACKGROUND

Field

This disclosure relates generally to electronic circuits, and more specifically, to phase rotator control apparatus and method.

Related Art

Today, many integrated circuit (IC) and system-on-a-chip (SoC) devices for advanced automotive radar systems, for example, require high speed and high accuracy operation. The IC and SoC devices often include sophisticated circuitry for controlling these radar systems. As radar systems advance, requirements of the control circuits advance to meet performance targets. However, challenges exist in balancing product costs w % bile meeting these performance targets.

SUMMARY

Aspects of the disclosure are defined in the accompanying claims.

In a first aspect, there is provided a circuit comprising: a phase rotator core having a first input coupled to receive a first radio frequency (RF) signal, a second input coupled to receive a first phase control signal, and an output for providing an output signal; and a phase control block coupled to the phase rotator core. The phase control block comprises: a first transistor having a control electrode coupled to receive a first control signal; a second transistor having a control electrode coupled to receive a second control signal and a first current electrode coupled to a first current electrode of the first transistor; a third transistor having a control electrode and a first current electrode coupled to the first current electrodes of the first and second transistors; a first filter having first terminal coupled to the control electrode and the first current electrode of the third transistor; and a fourth transistor having a control electrode coupled to a second terminal of the first filter and a first current electrode coupled to the second input of the phase rotator core to provide the first phase control signal.

In one or more embodiments, the phase control block may further comprise: a first current source having a first terminal coupled to a first voltage supply and a second terminal coupled to a second current electrode of the first transistor; and a second current source having a first terminal coupled to the first voltage supply and a second terminal coupled to a second current electrode of the second transistor.

In one or more embodiments, the first filter may comprise: a first resistor having a first terminal coupled to the control electrode and the first current electrode of the third transistor and a second terminal coupled to the control electrode of the fourth transistor; and a first capacitor having a first terminal coupled to the second terminal of the first resistor and the control electrode of the fourth transistor.

In one or more embodiments, the phase control block may further comprise: a first switch having a first terminal coupled to the first current electrodes of the first and second transistors, a second terminal coupled to the control electrode and the first current electrode of the third transistor, and a control terminal coupled to receive a third control signal.

In one or more embodiments, the first switch may be configured to be closed based on a first state of the third control signal and open based on a second state of the third control signal.

In one or more embodiments, the phase control block may further comprise: a multi-stage noise shaping (MASH) block coupled to provide the first control signal and the second control based on a main control signal.

In one or more embodiments, the phase control block may further comprise: a fifth transistor having a control electrode coupled to receive a first complement signal, the first complement signal characterized as an inverted version of the first control signal; a sixth transistor having a control electrode and a first current electrode coupled to a first current electrode of the fifth transistors; a second filter having a first terminal coupled to the control electrode and the first current electrode of the sixth transistor; and a seventh transistor having a control electrode coupled to a second terminal of the second filter and a first current electrode coupled to a third input of the phase rotator core to provide a second phase control signal.

In one or more embodiments, the first phase control signal and the second phase control signal together may comprise a differential phase control signal, and the second and third inputs of the phase rotator core together may be characterized as a differential input for receiving the differential phase control signal.

In one or more embodiments, the phase control block may further comprise: an eighth transistor having a control electrode coupled to receive a second complement signal and a first current electrode coupled to the first current electrode of the fifth transistor, the second complement signal characterized as an inverted version of the second control signal.

In a second aspect, there is provided a circuit comprising: a phase rotator core having a first input coupled to receive a first radio frequency (RF) signal, a second input coupled to receive a first phase control signal, and an output for providing an output signal; and a phase control block coupled to the phase rotator core. The phase control block comprises: a first transistor having a control electrode coupled to receive a first control signal, a first current electrode, and a second current electrode; a second transistor having a control electrode coupled to receive a second control signal and a first current electrode coupled to the first current electrode of the first transistor; a first switch having a first terminal coupled to the first current electrodes of the first and second transistors, and a control terminal coupled to receive a third control signal; a third transistor having a control electrode and a first current electrode coupled to a second terminal of the first switch; a first filter having a first terminal coupled to the control electrode and the first current electrode of the third transistor; and a fourth transistor having a control electrode coupled to a second terminal of the first filter and a first current electrode coupled to the second input of the phase rotator core to provide the first phase control signal.

In one or more embodiments, the phase control block may further comprise: a first current source having a first terminal coupled to a first voltage supply and a second terminal coupled to the second current electrode of the first transistor; and a second current source having a first terminal coupled to the first voltage supply and a second terminal coupled to a second current electrode of the second transistor.

In one or more embodiments, the phase control block may further comprise a first variable current source having a first terminal coupled to the first voltage supply and a second terminal coupled to the second current electrode of the first transistor.

In one or more embodiments, the first filter may comprise: a first resistor having a first terminal coupled to the control electrode and the first current electrode of the third transistor and a second terminal coupled to the control electrode of the fourth transistor; and a first capacitor having a first terminal coupled to the second terminal of the first resistor and the control electrode of the fourth transistor.

In one or more embodiments, the first switch may be configured to be closed during a sample phase of the phase control block and open during a hold phase of the phase control block.

In one or more embodiments, the phase control block may further comprise a multi-stage noise shaping (MASH) block coupled to provide the first control signal and the second control based on a main control signal.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Generally, there is provided, a phase rotator control system including analog control signals generated by digital-to-analog converter (DAC) with embedded filter circuitry. A multi-stage noise shaping (MASH) circuit block provides a reduced set of digital control signals to the DAC circuitry. A sample-and-hold circuit arrangement within the DAC circuitry allows for low noise and power efficient operation of a radar system during chirp time periods, for example, and allows for new phase values to be updated during inter-chirp time periods.

Figure 1:
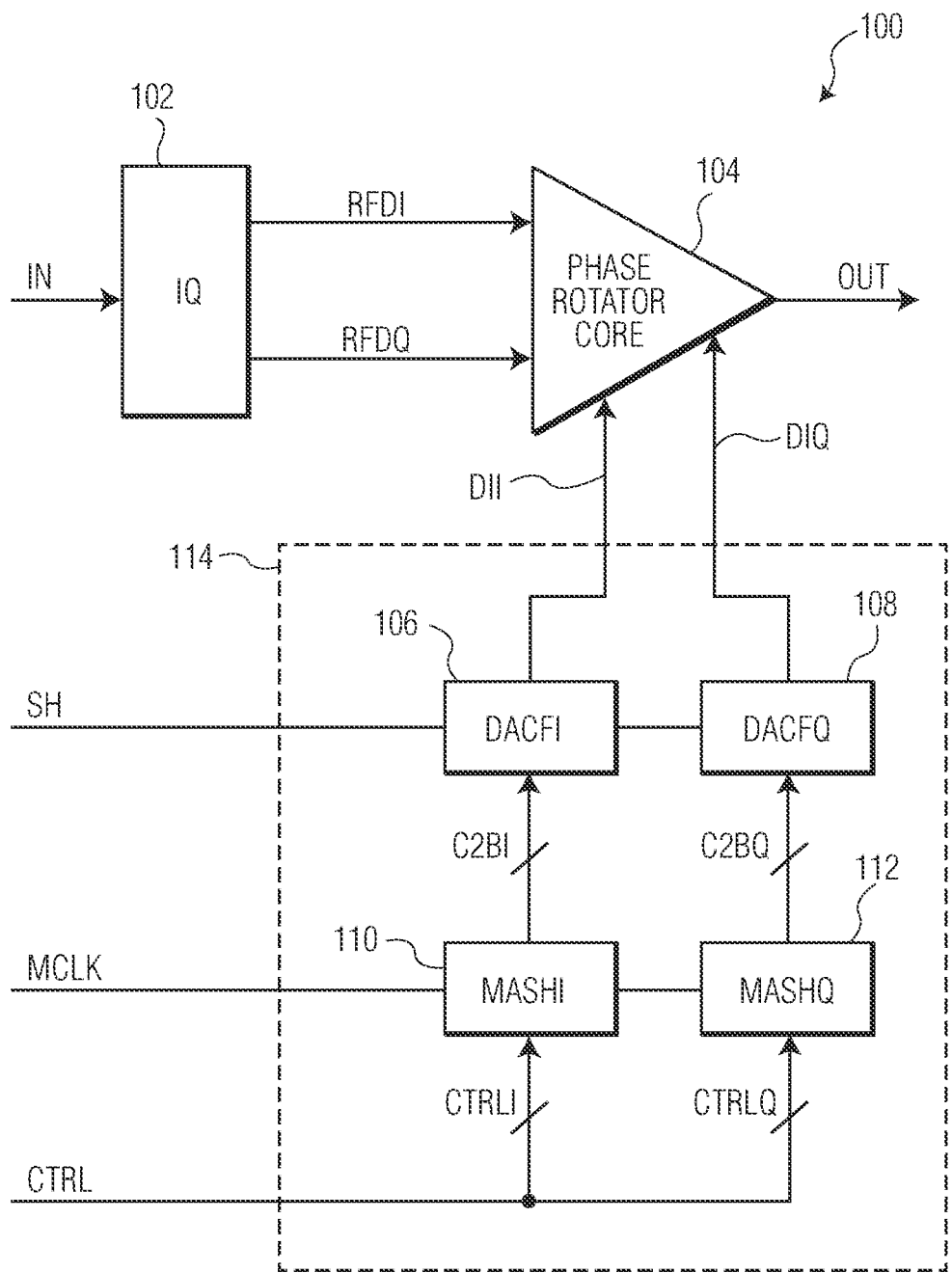
FIG. 1 illustrates, in simplified block diagram form, an example phase rotator in accordance with an embodiment.

FIG. 1 illustrates, in simplified block diagram form, an example phase rotator 100 in accordance with an embodiment. Phase rotator 100 includes an input labeled IN for receiving a radio frequency (RF) signal, an output labeled OUT for providing an output signal OUT, a sample and hold control signal labeled SH, and a multi-bit control signal labeled CTRL. In this example, phase rotator 100 includes a quadrature splitter circuit block 102 labeled IQ, a phase rotator core circuit block 104, and a phase control circuit block 114. The phase control circuit block 114 includes a first digital-to-analog converter (DAC) with integrated filter circuit sub-block 106 labeled DACFI, a second DAC with integrated filter circuit sub-block 108 labeled DACFQ, a first multi-stage noise shaping (MASH) circuit sub-block 110 labeled MASHI, and a second MASH circuit sub-block 112 labeled MASHQ.

The IQ circuit block 102 is configured and arranged to receive an RF signal and in turn, generate a corresponding complex (IQ) RF signal consisting of a first (I) signal component labeled RFDI and a second (Q) signal component labeled RFDQ. In this embodiment, the RFDI signal component is characterized as an in-phase signal being substantially in phase with the received RF signal and the RFDQ signal component is characterized as a quadrature signal being substantially 90 degrees out of phase with the received RF signal. For example, the RFDI signal may have a cosine waveform and the RFDQ signal may have a sine waveform. In this embodiment, each of the RFDI and RFDQ signals is formed as a differential signal pair having a "+" component and a "−" complementary component.

The phase rotator core circuit block 104 is configured and arranged to receive the complex RF signal (e.g., RFDI and RFDQ signals) at a first set of inputs, a complex control signal (e.g., DII and DIQ signals) at a second set of inputs, and in turn, generate the OUT signal at the output labeled OUT. In this embodiment, the RFDI and RFDQ signals are modulated by the respective DII and DIQ controls signals and subsequently combined to generate the OUT signal.

The phase control circuit block 114 is configured and arranged to receive the SH control signal at inputs of the DACFI and DACFQ circuits, the CTRL control signal (e.g., CTRLI and CTRLQ control signals) at inputs of the MASHI and MASHQ circuits, and in turn, generate the complex control signal (e.g., DII and DIQ signals) at outputs of the DACFI and DACFQ circuits. In this embodiment, the CTRL control signal consists of a first (I) control signal labeled CTRLI and a second (Q) control signal labeled CTRLQ. For example, the multibit CTRL control signal may include the CTRLI control signal formed as a first 8-bit control signal and the CTRLQ formed as a second 8-bit control signal.

The MASHI and MASHQ circuits (110, 112) are configured and arranged to receive the CTRLI and CTRLQ control signals respectively at inputs and in turn, generate control signals labeled C2BI and C2BQ respectively at outputs. For example, each of the MASHI and MASHQ circuits receives a multi-bit control signal (e.g., CTRLI and CTRLQ control signals) which is quantized into a 2-bit control signal (e.g., C2BI and C2BQ control signals). In this embodiment, each of the MASHI and MASHQ circuits includes two first-order sigma delta converters coupled in series to generate a second-order quantized sigma delta output signal (e.g., 2-bit C2BI and C2BQ control signals).

The DACFI and DACFQ circuits (106, 108) are configured and arranged to receive the C2BI and C2BQ control signals respectively at inputs and in turn, generate the DII and DIQ controls signals respectively at outputs. In this embodiment, each of the DACFI and DACFQ circuits receives a 2-bit control signal (e.g., C2BI and C2BQ control signals) which is converted into an analog control signal (e.g., C2BI and C2BQ control signals). In this embodiment, each of the analog DII and DIQ control signals may be characterized as a differential control signal.

Figure 2A:
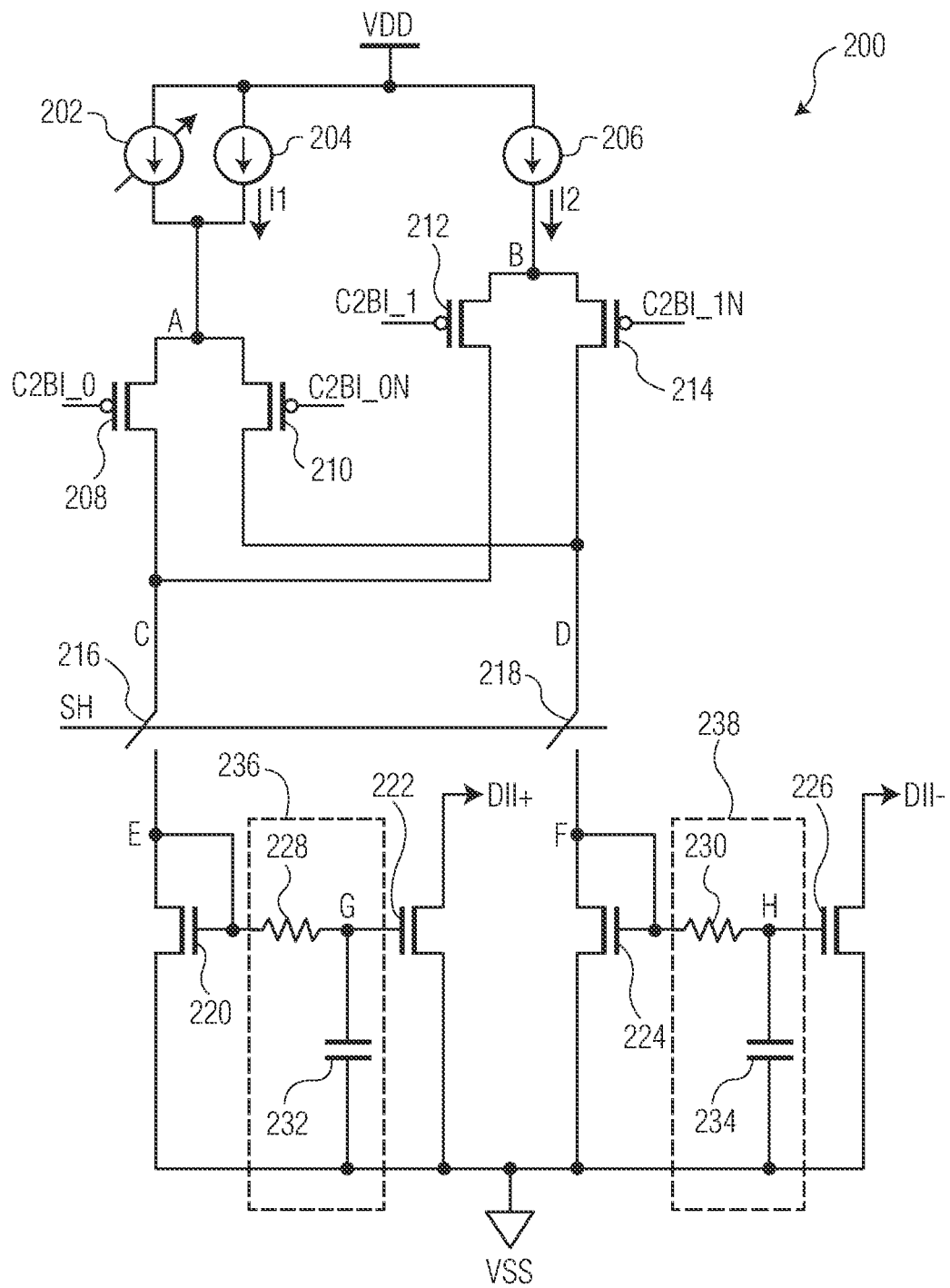
FIG. 2A and FIG. 2B illustrate, in simplified schematic diagram form, an example phase control circuit sub-block implementation in accordance with an embodiment.

FIG. 2A illustrates, in simplified schematic diagram form, an example DACFI implementation 200 of the circuit block 106 included in the phase control block 114 in accordance with an embodiment. In this embodiment, the DACFI circuit 200 includes current sources 202-206. P-channel transistors 208-214, N-channel transistors 220-226, switches 216-218, and filter circuits 236-238. The DACFI circuit 200 is configured to receive the digital 2-bit C2BI control signals labeled C2BI_0 and C2BI_1 and their respective complement or inverted signal versions labeled C2BI_0N and C2BI_1N, the SH control signal, and generates the analog differential DII control signals labeled DII+ and DII− at corresponding differential outputs. In this embodiment, the DACFI circuit 200 generates the analog differential DII control signals based on the digital 2-bit C2BI control signals.

A first current source 202 and a second current source 204 are coupled in parallel between a first voltage supply terminal labeled VDD and node A. In this embodiment, a normal operating voltage is supplied at the VDD supply terminal. A first terminal of variable current source 202 and a first terminal of current source 204 are connect to the VDD supply terminal and second terminals of current sources 202 and 204 are connected at node A. A third current source 206 is coupled between the VDD supply terminal and node B. Current source 204 is configured to provide a first current I1 and current source 206 is configured to provide a second current I2. In this embodiment, the current I2 is substantially equal to 2 times the current I1 (e.g., a ratio of current I2 to current I1 is 2:1). In other embodiments, the relationship of current I2 to current I1 may have other ratios. In this embodiment, current source 202 may be configured to provide an adjustable trim current for improving accuracy by compensating for integral nonlinearity, for example.

A first current electrode of transistor 208 is connected to current sources 202 and 204 at node A, a second current electrode of transistor 208 is connected to a first terminal of switch 216 at node C, and a control electrode of transistor 208 is configured to receive the C2BI_0 control signal. A first current electrode of transistor 210 is connected to the first current electrode of transistor 208 and current sources 202 and 204 at node A, a second current electrode of transistor 210 is connected to a first terminal of switch 218 at node D, and a control electrode of transistor 210 is configured to receive the C2BI_0N complement control signal.

A first current electrode of transistor 212 is connected to current source 206 at node B, a second current electrode of transistor 212 is connected to the second current electrode of transistor 208 and the first terminal of switch 216 at node C, and a control electrode of transistor 212 is configured to receive the C2BI_1 control signal. A first current electrode of transistor 214 is connected to the first current electrode of transistor 212 and current source 206 at node B, a second current electrode of transistor 214 is connected to the first terminal of switch 218 at node D, and a control electrode of transistor 214 is configured to receive the C2BI_1N complement control signal.

A first current mirror is formed including transistors 220 and 222 coupled together by way of a first filter circuit 236. A first current electrode and a control electrode of transistor 220 is connected to a second terminal of switch 216 and a first terminal of filter circuit 236 at node E. and a second current electrode of transistor 220 is connected to a second voltage supply terminal labeled VSS. A first current electrode of transistor 222 is coupled to provide the DII+ signal component of the differential DII control signal, a second current electrode of transistor 222 is connected to the VSS supply terminal, and a control electrode of transistor 222 is connected to a second terminal of filter circuit 236 at node G. In this embodiment, the first filter circuit 236 includes a first resistor 228 and a first capacitor 232. A first terminal of resistor 228 is connected at node E, a second terminal of resistor 228 is connected to a first terminal of capacitor 232 at node G, and a second terminal of capacitor 232 is connected at the VSS supply terminal. In this embodiment, a ground voltage (e.g., 0 volts) is supplied at the VSS supply terminal.

A second current mirror is formed including transistors 224 and 226 coupled together by way of a second filter circuit 238. A first current electrode and a control electrode of transistor 224 is connected to a second terminal of switch 218 and a first terminal of filter circuit 238 at node F, and a second current electrode of transistor 224 is connected to the VSS supply terminal. A first current electrode of transistor 226 is coupled to provide the DII− signal component of the differential DII control signal, a second current electrode of transistor 226 is connected to the VSS supply terminal, and a control electrode of transistor 226 is connected to a second terminal of filter circuit 238 at node H. In this embodiment, the second filter circuit 238 includes a second resistor 230 and a second capacitor 234. A first terminal of resistor 230 is connected at node F, a second terminal of resistor 230 is connected to a first terminal of capacitor 234 at node H, and a second terminal of capacitor 234 is connected at the VSS supply terminal. Control terminals of switches 216 and 218 are configured to receive the SH control signal.

In operation, the 2-bit C2BI control signals C2BI_0 and C2BI_1 and their respective complement signals C2BI_0N and C2BI_1N are received at the control electrodes of transistors 208-214. When the SH control signal is at a first state (e.g., sample mode), switches 216-218 are closed allowing corresponding currents (e.g., I1 and I2) selected by way of the C2BI control signals to propagate to the first and second current mirrors accordingly. For example, when C2BI_0 is at a logic low and C2BI_1 is at a logic low, the current generated for DII+ is substantially equal to I1+I2 and the current generated for DII− is substantially equal to 0; when C2BI_0 is at a logic high and C2BI_1 is at a logic low, the current generated for DII+ is substantially equal to I2 and the current generated for DII− is substantially equal to I1; when C2BI_0 is at a logic low and C2BI_1 is at a logic high, the current generated for DII+ is substantially equal to I1 and the current generated for DII− is substantially equal to I2; and when C2BI_0 is at a logic high and C2BI_1 is at a logic high, the current generated for DII+ is substantially equal to 0 and the current generated for DII− is substantially equal to I1+I2. In this embodiment, the first state of the SH control signal may occur during inter-chirp time periods (e.g., between consecutive chirps) of a radar system. During these inter-chirp periods, the capacitors 232-234 of the filter circuits 236-238 are refreshed or charged to new values based on the C2BI control signals.

When the SH control signal is at a second state (e.g., hold mode), switches 216-218 are open allowing charged values to be stored on the capacitors 232-234 of the filter circuits 236-238. For example, values of the DII+ and DII− signal components are held based on the charge values of the capacitors 232-234. In this embodiment, the second state of the SH control signal may occur during chirp time periods (e.g., active portions of radar modulation) of the radar system. Because the DII+ and DII− signal components are held based on the charge values of the capacitors 232-234 during these chirp time periods, noise and power consumption are reduced.

Figure 2B:
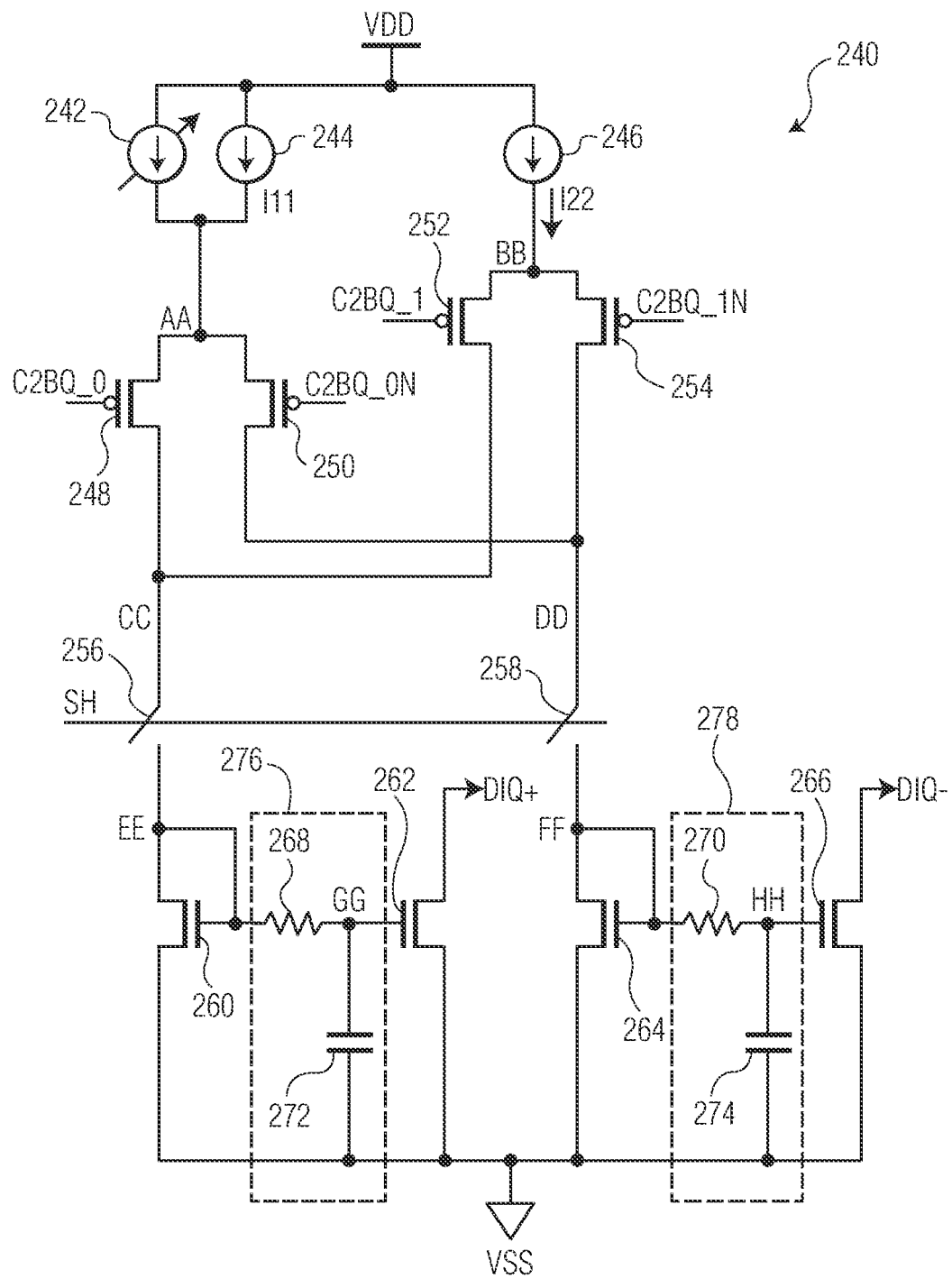

FIG. 2B illustrates, in simplified schematic diagram form, an example DACFQ implementation 240 of the circuit block 108 included in the phase control block 114 in accordance with an embodiment. In this embodiment, the DACFQ circuit 240 includes current sources 242-246, P-channel transistors 248-254, N-channel transistors 260-266, switches 256-258, and filter circuits 276-278. The DACFQ circuit 240 is configured to receive the 2-bit C2BQ control signals labeled C2BQ_0 and C2BQ_1 and their respective complement or inverted signal versions labeled C2BQ_0N and C2BQ_1N, the SH control signal, and generates the differential DIQ control signals labeled DIQ+ and DIQ− at corresponding differential outputs. In this embodiment, the DACFQ circuit 240 generates the analog differential DIQ control signals based on the digital 2-bit C2BQ control signals.

A fourth current source 242 and a fifth current source 244 are coupled in parallel between the VDD supply terminal and node AA. A first terminal of variable current source 242 and a first terminal of current source 244 are connect to the VDD supply terminal and second terminals of current sources 242 and 244 are connected at node AA. A sixth current source 246 is coupled between the VDD supply terminal and node BB. Current source 244 is configured to provide a third current I11 and current source 206 is configured to provide a fourth current I22. In this embodiment, the current I11 is substantially equal to the current I1, and the current I22 is substantially equal to 2 times the current I11 (e.g., a ratio of current I22 to current I11 is 2:1). In other embodiments, the relationship of current I22 to current I11 may have other ratios. In this embodiment, current source 242 may be configured to provide an adjustable trim current for improving accuracy by compensating for integral non-linearity, for example.

A first current electrode of transistor 248 is connected to current sources 242 and 244 at node AA, a second current electrode of transistor 248 is connected to a first terminal of switch 216 at node CC, and a control electrode of transistor 208 is configured to receive the C2BQ_0 control signal. A first current electrode of transistor 250 is connected to the first current electrode of transistor 248 and current sources 242 and 244 at node AA, a second current electrode of transistor 250 is connected to a first terminal of switch 258 at node DD, and a control electrode of transistor 250 is configured to receive the C2BQ_0N complement control signal.

A first current electrode of transistor 252 is connected to current source 246 at node BB, a second current electrode of transistor 252 is connected to the second current electrode of transistor 248 and the first terminal of switch 256 at node CC, and a control electrode of transistor 252 is configured to receive the C2BQ_1 control signal. A first current electrode of transistor 254 is connected to the first current electrode of transistor 252 and current source 246 at node BB, a second current electrode of transistor 254 is connected to the first terminal of switch 258 at node DD, and a control electrode of transistor 254 is configured to receive the C2BQ_1N complement control signal.

A third current mirror is formed including transistors 260 and 262 coupled together by way of a third filter circuit 276. A first current electrode and a control electrode of transistor 260 is connected to a second terminal of switch 256 and a first terminal of filter circuit 276 at node EE, and a second current electrode of transistor 260 is connected to the VSS supply terminal. A first current electrode of transistor 262 is coupled to provide the DIQ+ signal component of the differential DIQ control signal, a second current electrode of transistor 262 is connected to the VSS supply terminal, and a control electrode of transistor 262 is connected to a second terminal of filter circuit 276 at node GG. In this embodiment, the third filter circuit 276 includes a third resistor 268 and a third capacitor 272. A first terminal of resistor 268 is connected at node EE, a second terminal of resistor 268 is connected to a first terminal of capacitor 272 at node GG, and a second terminal of capacitor 272 is connected at the VSS supply terminal.

A fourth current mirror is formed including transistors 264 and 266 coupled together by way of a fourth filter circuit 278. A first current electrode and a control electrode of transistor 264 is connected to a second terminal of switch 258 and a first terminal of filter circuit 278 at node FF, and a second current electrode of transistor 264 is connected to the VSS supply terminal. A first current electrode of transistor 266 is coupled to provide the DIQ− signal component of the differential DIQ control signal, a second current electrode of transistor 266 is connected to the VSS supply terminal, and a control electrode of transistor 266 is connected to a second terminal of filter circuit 278 at node HH. In this embodiment, the fourth filter circuit 278 includes a fourth resistor 270 and a fourth capacitor 274. A first terminal of resistor 270 is connected at node FF, a second terminal of resistor 270 is connected to a first terminal of capacitor 274 at node HH, and a second terminal of capacitor 274 is connected at the VSS supply terminal. Control terminals of switches 256 and 258 are configured to receive the SH control signal.

In operation, the 2-bit C2BQ control signals C2BQ_0 and C2BQ_1 and their respective complement signals C2BQ_0N and C2BQ_1N are received at the control electrodes of transistors 248-254. When the SH control signal is at the first state (e.g., sample mode), switches 256-258 are closed allowing corresponding currents (e.g., I11 and I22) selected by way of the C2BQ control signals to propagate to the third and fourth current mirrors accordingly. For example, when C2BQ_0 is at a logic low and C2BQ_1 is at a logic low, the current generated for DIQ+ is substantially equal to I11+I22 and the current generated for DIQ− is substantially equal to 0; when C2BQ_0 is at a logic high and C2BQ_1 is at a logic low, the current generated for DIQ+ is substantially equal to I22 and the current generated for DIQ− is substantially equal to I11; when C2BQ_0 is at a logic low and C2BQ_1 is at a logic high, the current generated for DIQ+ is substantially equal to I11 and the current generated for DIQ− is substantially equal to I22; and when C2BQ_0 is at a logic high and C2BQ_1 is at a logic high, the current generated for DIQ+ is substantially equal to 0 and the current generated for DIQ− is substantially equal to I11+I22. In this embodiment, the first state of the SH control signal may occur during inter-chirp time periods of the radar system. During these inter-chirp periods, the capacitors 272-274 of the filter circuits 276-278 are refreshed or charged to new values based on the C2BQ control signals.

When the SH control signal is at the second state (e.g., hold mode), switches 256-258 are open allowing charged values to be stored on the capacitors 272-274 of the filter circuits 276-278. For example, values of the DIQ+ and DIQ− signal components are held based on the charge values of the capacitors 272-274. In this embodiment, the second state of the SH control signal may occur during chirp time periods of the radar system. Because the DIQ+ and DIQ− signal components are held based on the charge values of the capacitors 272-274 during these chirp time periods, noise and power consumption are reduced.

Figure 3:
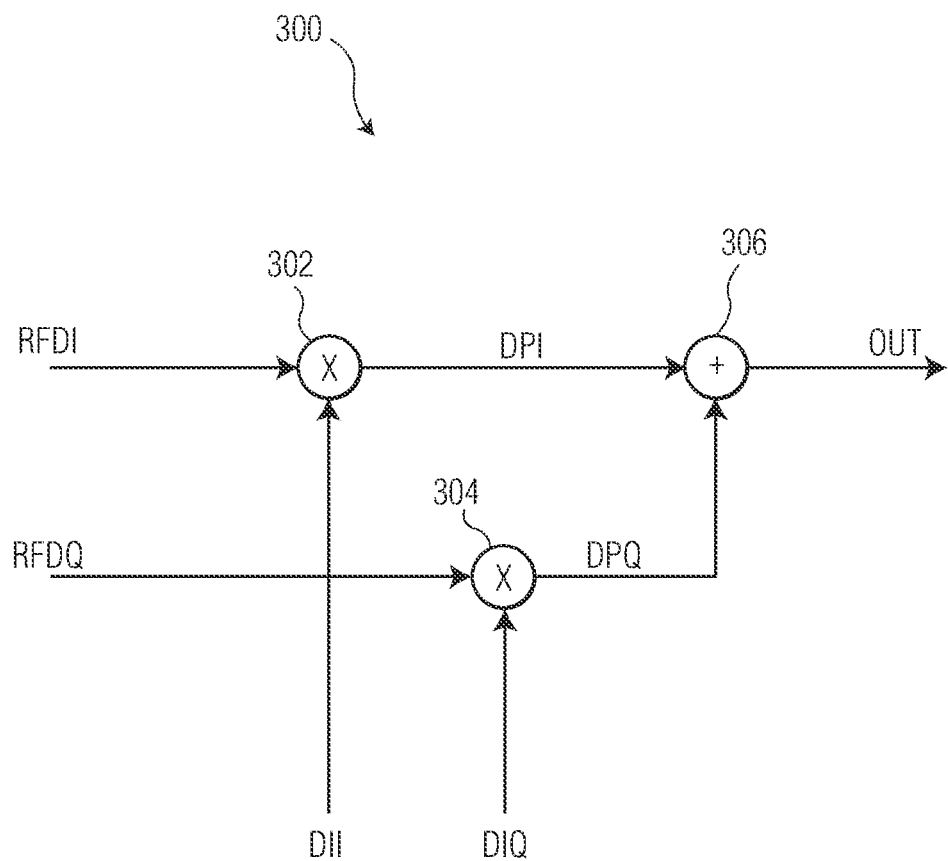
FIG. 3 illustrates, in simplified block diagram form, an example phase rotator core implementation in accordance with an embodiment.

FIG. 3 illustrates, in simplified block diagram form, an example phase rotator core implementation 300 of the circuit block 104 of FIG. 1 in accordance with an embodiment. The phase rotator core 300 is configured and arranged to receive the RFDI and RFDQ differential signal pairs, the DII and DIQ differential control signal pairs, and, in turn, generate the output signal OUT. In this embodiment, the phase rotator core 300 includes multiplication mixer circuits 302 and 304 and summing circuit 306.

A first input of mixer 302 is configured to receive the RFDI differential signal pair, a second input of mixer 304 is configured to receive the DII differential control signal pair, and an output of mixer 302 is configured to provide a first differential product signal labeled DPI. A first input of mixer 304 is configured to receive the RFDQ differential signal pair, a second input of mixer 304 is configured to receive the DIQ differential control signal pair, and an output of mixer 304 is configured to provide a second differential product signal labeled DPQ. A first input of mixer 306 is configured to receive the DPI differential signal pair, a second input of mixer 306 is configured to receive the DPQ differential signal pair, and an output of mixer 306 is configured to provide a summed differential output signal labeled OUT.

Figure 4:
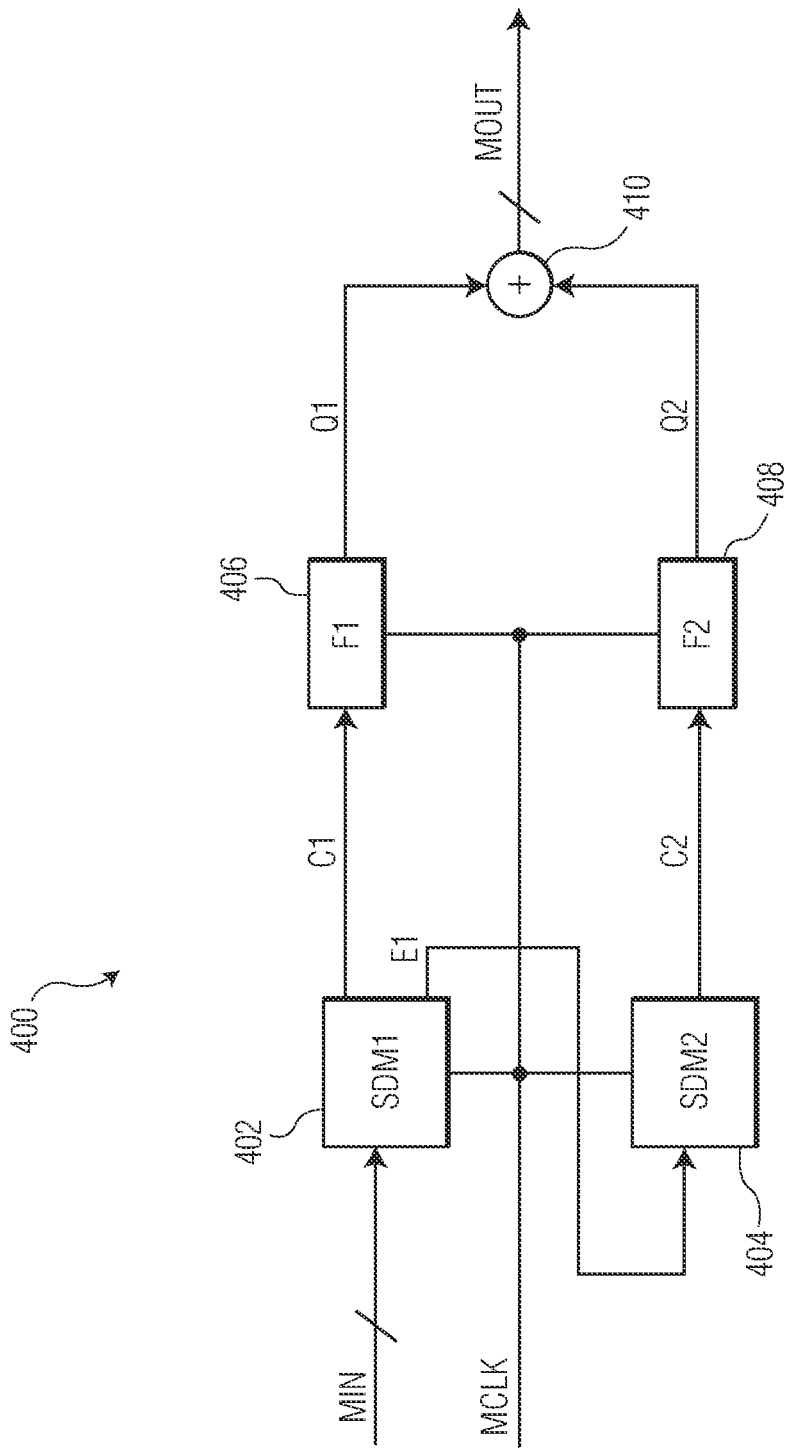
FIG. 4 illustrates, in simplified block diagram form, an example multi-stage noise shaping (MASH) sub-block implementation in accordance with an embodiment.

FIG. 4 illustrates, in simplified block diagram form, an example MASH implementation 400 corresponding to circuit blocks 110 and 112 of FIG. 1 in accordance with an embodiment. The MASH circuit block 400 is configured and arranged to receive a multi-bit (e.g., 8-bit) control signal labeled MIN (e.g., corresponding to CTRLI and CRTLQ) at a first input, a MASH clock labeled MCLK at a second input, and in turn, generate a 2-bit output control signal MOUT (e.g., corresponding to C2BI and C2BQ) at an output. In this embodiment, the MASH circuit block 400 includes a first sigma-delta modulator 402 labeled SDM1, a second sigma-delta modulator 404 labeled SDM2, a first filter circuit 406 labeled F1, a second filter circuit 408 labeled F2, and a combining circuit 410.

A first input of the sigma-delta modulator 402 is configured to receive the MIN control signal (e.g., CTRLI, CRTLQ), a second input of the sigma-delta modulator 402 is configured to receive the MCLK clock signal, and in turn, a first converted signal labeled C1 is generated at a first output and a noise error signal labeled E1 is generated at a second output. A first input of filter circuit 406 is configured to receive the C1 signal, a second input of the filter circuit 406 is configured to receive the MCLK clock signal, and in turn, a first decimated signal labeled Q1 is generated at an output. In this embodiment, filter circuit 406 is characterized as a decimation filter having a transfer function of $z^{-1}$. A first input of the sigma-delta modulator 404 is configured to receive the E1 signal, a second input of the sigma-delta modulator 404 is configured to receive the MCLK clock signal, and in turn, a second converted signal labeled C2 is generated at an output. A first input of filter circuit 408 is configured to receive the C2 signal, a second input of the filter circuit 408 is configured to receive the MCLK clock signal, and in turn, a second decimated signal labeled Q2 is generated at an output. In this embodiment, filter circuit 408 is characterized as a decimation filter having a transfer function of $1-z^{-1}$. A first input of the combining circuit 410 is configured to receive the Q1 signal, a second input of the combining circuit 410 is configured to receive the Q2 signal, and in turn, generate the 2-bit control signal MOUT (e.g., C2BI, C2BQ) at an output. In this embodiment, the Q2 signal is subtracted from the Q1 signal to generate the MOUT signal.

Generally, there is provided, a circuit including a phase rotator core having a first input coupled to receive a first radio frequency (RF) signal, a second input coupled to receive a first phase control signal, and an output for providing an output signal, a phase control block coupled to the phase rotator core, the phase control block comprising: a first transistor having a control electrode coupled to receive a first control signal, a second transistor having a control electrode coupled to receive a second control signal and a first current electrode coupled to a first current electrode of the first transistor; a third transistor having a control electrode and a first current electrode coupled to the first current electrodes of the first and second transistors; a first filter having first terminal coupled to the control electrode and the first current electrode of the third transistor; and a fourth transistor having a control electrode coupled to a second terminal of the first filter and a first current electrode coupled to the second input of the phase rotator core to provide the first phase control signal. The phase control block may further include a first current source having a first terminal coupled to a first voltage supply and a second terminal coupled to a second current electrode of the first transistor; and a second current source having a first terminal coupled to the first voltage supply and a second terminal coupled to a second current electrode of the second transistor. The first filter may include a first resistor having a first terminal coupled to the control electrode and the first current electrode of the third transistor and a second terminal coupled to the control electrode of the fourth transistor; and a first capacitor having a first terminal coupled to the second terminal of the first resistor and the control electrode of the fourth transistor. The phase control block may further include a first switch having a first terminal coupled to the first current electrodes of the first and second transistors, a second terminal coupled to the control electrode and the first current electrode of the third transistor, and a control terminal coupled to receive a third control signal. The first switch may be configured to be closed based on a first state of the third control signal and open based on a second state of the third control signal. The phase control block may further include a multi-stage noise shaping (MASH) block coupled to provide the first control signal and the second control based on a main control signal. The phase control block may further include a fifth transistor having a control electrode coupled to receive a first complement signal, the first complement signal characterized as an inverted version of the first control signal; a sixth transistor having a control electrode and a first current electrode coupled to a first current electrode of the fifth transistors; a second filter having a first terminal coupled to the control electrode and the first current electrode of the sixth transistor; and a seventh transistor having a control electrode coupled to a second terminal of the second filter and a first current electrode coupled to a third input of the phase rotator core to provide a second phase control signal. The first phase control signal and the second phase control signal together may form a differential phase control signal, and wherein the second and third inputs of the phase rotator core together are characterized as a differential input for receiving the differential phase control signal. The phase control block may further include an eighth transistor having a control electrode coupled to receive a second complement signal and a first current electrode coupled to the first current electrode of the fifth transistor, the second complement signal characterized as an inverted version of the second control signal.

In another embodiment, there is provided, a circuit including a phase rotator core having a first input coupled to receive a first radio frequency (RF) signal, a second input coupled to receive a first phase control signal, and an output for providing an output signal; a phase control block coupled to the phase rotator core, the phase control block comprising: a first transistor having a control electrode coupled to receive a first control signal, a first current electrode, and a second current electrode; a second transistor having a control electrode coupled to receive a second control signal and a first current electrode coupled to the first current electrode of the first transistor; a first switch having a first terminal coupled to the first current electrodes of the first and second transistors, and a control terminal coupled to receive a third control signal; a third transistor having a control electrode and a first current electrode coupled to a second terminal of the first switch; a first filter having a first terminal coupled to the control electrode and the first current electrode of the third transistor; and a fourth transistor having a control electrode coupled to a second terminal of the first filter and a first current electrode coupled to the second input of the phase rotator core to provide the first phase control signal. The phase control block may further include a first current source having a first terminal coupled to a first voltage supply and a second terminal coupled to the second current electrode of the first transistor; and a second current source having a first terminal coupled to the first voltage supply and a second terminal coupled to a second current electrode of the second transistor. The phase control block may further include a first variable current source having a first terminal coupled to the first voltage supply and a second terminal coupled to the second current electrode of the first transistor. The first filter may include a first resistor having a first terminal coupled to the control electrode and the first current electrode of the third transistor and a second terminal coupled to the control electrode of the fourth transistor; and a first capacitor having a first terminal coupled to the second terminal of the first resistor and the control electrode of the fourth transistor. The first switch may be configured to be closed during a sample phase of the phase control block and open during a hold phase of the phase control block. The phase control block may further include a multi-stage noise shaping (MASH) block coupled to provide the first control signal and the second control based on a main control signal. The phase control block may further include a fifth transistor having a control electrode coupled to receive a first complement signal and a first current electrode coupled to the second current electrode of the first transistor, the first complement signal characterized as an inverse of the first control signal; a second switch having a first terminal coupled to a first current electrode of the fifth transistor, and a control terminal coupled to receive the third control signal; a sixth transistor having a control electrode and a first current electrode coupled to a second terminal of the second switch; a second filter having a first terminal coupled to the control electrode and the first current electrode of the sixth transistor; and a seventh transistor having a control electrode coupled to a second terminal of the second filter and a first current electrode coupled to a third input of the phase rotator core to provide a second phase control signal. The first phase control signal and the second phase control signal together may form a differential phase control signal, and wherein the second and third inputs of the phase rotator core together are characterized as a differential input for receiving the differential phase control signal.

In yet another embodiment, there is provided, a circuit including a phase rotator core having a first input coupled to receive a first radio frequency (RF) signal, a second input coupled to receive a first phase control signal, and an output for providing an output signal; a phase control block coupled to the phase rotator core, the phase control block comprising: a first transistor having a control electrode coupled to receive a first control signal and a first current electrode coupled at a first node; a second transistor having a control electrode coupled to receive a second control signal and a first current electrode coupled at a second node, the second control signal a complement signal of the first control signal; a third transistor having a control electrode and a first current electrode coupled to the first current electrode of the first transistor; a first filter having first terminal coupled to the control electrode and the first current electrode of the third transistor; a fourth transistor having a control electrode coupled to a second terminal of the first filter and a first current electrode coupled to the second input of the phase rotator core to provide the first phase control signal; and a first current source having a first terminal coupled to a first voltage supply and a second terminal coupled to a second current electrode of the first transistor and a second current electrode of the second transistor. The phase control block may further include a first switch having a first terminal coupled to the first current electrode of the first transistor at the first node, a second terminal coupled to the control electrode and the first current electrode of the third transistor, and a control terminal coupled to receive a third control signal; and a second switch having a first terminal coupled to the first current electrode of the second transistor at the second node and a control terminal coupled to receive the third control signal. The first filter may include a first resistor having a first terminal coupled to the control electrode and the first current electrode of the third transistor at the first terminal of the first filter and a second terminal coupled to the control electrode of the fourth transistor at the second terminal of the first filter; and a first capacitor having a first terminal coupled to the second terminal of the first resistor and the control electrode of the fourth transistor.

By now it should be appreciated that there has been provided, a phase rotator control system including analog control signals generated by digital-to-analog converter (DAC) with embedded filter circuitry. A multi-stage noise shaping (MASH) circuit block provides a reduced set of digital control signals to the DAC circuitry. A sample-and-hold circuit arrangement within the DAC circuitry allows for low noise and power efficient operation of a radar system during chirp time periods, for example, and allows for new phase values to be seamlessly updated during inter-chirp time periods.

A phase rotator control circuit is provided. The phase rotator control circuit is coupled to a phase rotator core and includes a first set of transistors coupled to receive digital control signals. The first set of transistors is coupled to a second set of transistors configured and arranged to form a filtered current mirror. An output of the filtered current mirror is coupled to provide an analog phase control signal to the phase rotator core.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

The invention claimed is:

1. A circuit comprising:
a phase rotator core having a first input coupled to receive a first radio frequency (RF) signal, a second input coupled to receive a first phase control signal, and an output for providing an output signal;
a phase control block coupled to the phase rotator core, the phase control block comprising:
a first transistor having a control electrode coupled to receive a first control signal;
a second transistor having a control electrode coupled to receive a second control signal and a first current electrode coupled to a first current electrode of the first transistor;
a third transistor having a control electrode and a first current electrode coupled to the first current electrodes of the first and second transistors;
a first filter having first terminal coupled to the control electrode and the first current electrode of the third transistor; and
a fourth transistor having a control electrode coupled to a second terminal of the first filter and a first current electrode coupled to the second input of the phase rotator core to provide the first phase control signal.

2. The circuit of claim 1, wherein the phase control block further comprises:
a first current source having a first terminal coupled to a first voltage supply and a second terminal coupled to a second current electrode of the first transistor; and
a second current source having a first terminal coupled to the first voltage supply and a second terminal coupled to a second current electrode of the second transistor.

3. The circuit of claim 1, wherein the first filter comprises:
a first resistor having a first terminal coupled to the control electrode and the first current electrode of the third transistor and a second terminal coupled to the control electrode of the fourth transistor; and
a first capacitor having a first terminal coupled to the second terminal of the first resistor and the control electrode of the fourth transistor.

4. The circuit of claim 1, wherein the phase control block further comprises:
a first switch having a first terminal coupled to the first current electrodes of the first and second transistors, a second terminal coupled to the control electrode and the first current electrode of the third transistor, and a control terminal coupled to receive a third control signal.

5. The circuit of claim 4, wherein the first switch is configured to be closed based on a first state of the third control signal and open based on a second state of the third control signal.

6. The circuit of claim 1, wherein the phase control block further comprises:
a multi-stage noise shaping (MASH) block coupled to provide the first control signal and the second control based on a main control signal.

7. The circuit of claim 1, wherein the phase control block further comprises:
a fifth transistor having a control electrode coupled to receive a first complement signal, the first complement signal characterized as an inverted version of the first control signal;
a sixth transistor having a control electrode and a first current electrode coupled to a first current electrode of the fifth transistors;
a second filter having a first terminal coupled to the control electrode and the first current electrode of the sixth transistor; and
a seventh transistor having a control electrode coupled to a second terminal of the second filter and a first current electrode coupled to a third input of the phase rotator core to provide a second phase control signal.

8. The circuit of claim 7, wherein the first phase control signal and the second phase control signal together comprise a differential phase control signal, and wherein the second and third inputs of the phase rotator core together are characterized as a differential input for receiving the differential phase control signal.

9. The circuit of claim 7, wherein the phase control block further comprises:
an eighth transistor having a control electrode coupled to receive a second complement signal and a first current electrode coupled to the first current electrode of the fifth transistor, the second complement signal characterized as an inverted version of the second control signal.

10. A circuit comprising:
a phase rotator core having a first input coupled to receive a first radio frequency (RF) signal, a second input coupled to receive a first phase control signal, and an output for providing an output signal;
a phase control block coupled to the phase rotator core, the phase control block comprising:
a first transistor having a control electrode coupled to receive a first control signal, a first current electrode, and a second current electrode;
a second transistor having a control electrode coupled to receive a second control signal and a first current electrode coupled to the first current electrode of the first transistor;
a first switch having a first terminal coupled to the first current electrodes of the first and second transistors, and a control terminal coupled to receive a third control signal;
a third transistor having a control electrode and a first current electrode coupled to a second terminal of the first switch;
a first filter having a first terminal coupled to the control electrode and the first current electrode of the third transistor; and a fourth transistor having a control electrode coupled to a second terminal of the first filter and a first current electrode coupled to the second input of the phase rotator core to provide the first phase control signal.

11. The circuit of claim 10, wherein the phase control block further comprises:
a first current source having a first terminal coupled to a first voltage supply and a second terminal coupled to the second current electrode of the first transistor; and
a second current source having a first terminal coupled to the first voltage supply and a second terminal coupled to a second current electrode of the second transistor.

12. The circuit of claim 11, wherein the phase control block further comprises:
a first variable current source having a first terminal coupled to the first voltage supply and a second terminal coupled to the second current electrode of the first transistor.

13. The circuit of claim 10, wherein the first filter comprises:
a first resistor having a first terminal coupled to the control electrode and the first current electrode of the third transistor and a second terminal coupled to the control electrode of the fourth transistor; and
a first capacitor having a first terminal coupled to the second terminal of the first resistor and the control electrode of the fourth transistor.

14. The circuit of claim 10, wherein the first switch is configured to be closed during a sample phase of the phase control block and open during a hold phase of the phase control block.

15. The circuit of claim 10, wherein the phase control block further comprises:
a multi-stage noise shaping (MASH) block coupled to provide the first control signal and the second control based on a main control signal.

16. The circuit of claim 10, wherein the phase control block further comprises:
a fifth transistor having a control electrode coupled to receive a first complement signal and a first current electrode coupled to the second current electrode of the first transistor, the first complement signal characterized as an inverse of the first control signal;
a second switch having a first terminal coupled to a first current electrode of the fifth transistor, and a control terminal coupled to receive the third control signal;
a sixth transistor having a control electrode and a first current electrode coupled to a second terminal of the second switch;
a second filter having a first terminal coupled to the control electrode and the first current electrode of the sixth transistor; and
a seventh transistor having a control electrode coupled to a second terminal of the second filter and a first current electrode coupled to a third input of the phase rotator core to provide a second phase control signal.

17. The circuit of claim 16, wherein the first phase control signal and the second phase control signal together comprise a differential phase control signal, and wherein the second and third inputs of the phase rotator core together are characterized as a differential input for receiving the differential phase control signal.

18. A circuit comprising:
a phase rotator core having a first input coupled to receive a first radio frequency (RF) signal, a second input coupled to receive a first phase control signal, and an output for providing an output signal;
a phase control block coupled to the phase rotator core, the phase control block comprising:
a first transistor having a control electrode coupled to receive a first control signal and a first current electrode coupled at a first node;
a second transistor having a control electrode coupled to receive a second control signal and a first current electrode coupled at a second node, the second control signal a complement signal of the first control signal;
a third transistor having a control electrode and a first current electrode coupled to the first current electrode of the first transistor;
a first filter having first terminal coupled to the control electrode and the first current electrode of the third transistor;
a fourth transistor having a control electrode coupled to a second terminal of the first filter and a first current electrode coupled to the second input of the phase rotator core to provide the first phase control signal; and
a first current source having a first terminal coupled to a first voltage supply and a second terminal coupled to a second current electrode of the first transistor and a second current electrode of the second transistor.

19. The circuit of claim 18, wherein the phase control block further comprises:
a first switch having a first terminal coupled to the first current electrode of the first transistor at the first node, a second terminal coupled to the control electrode and the first current electrode of the third transistor, and a control terminal coupled to receive a third control signal; and
a second switch having a first terminal coupled to the first current electrode of the second transistor at the second node and a control terminal coupled to receive the third control signal.

20. The circuit of claim 18, wherein the first filter comprises:
a first resistor having a first terminal coupled to the control electrode and the first current electrode of the third transistor at the first terminal of the first filter and a second terminal coupled to the control electrode of the fourth transistor at the second terminal of the first filter; and
a first capacitor having a first terminal coupled to the second terminal of the first resistor and the control electrode of the fourth transistor.

* * * * *